United States Patent
Chikamori et al.

(10) Patent No.: US 10,242,876 B2
(45) Date of Patent: Mar. 26, 2019

(54) METHOD FOR MANUFACTURING SEMICONDUCTOR DEVICE

(71) Applicant: Mitsubishi Electric Corporation, Tokyo (JP)

(72) Inventors: Daisuke Chikamori, Tokyo (JP); Nobuaki Yamanaka, Tokyo (JP); Takamichi Iwakawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 2 days.

(21) Appl. No.: 15/546,878

(22) PCT Filed: Mar. 26, 2015

(86) PCT No.: PCT/JP2015/059299
§ 371 (c)(1),
(2) Date: Jul. 27, 2017

(87) PCT Pub. No.: WO2016/151829
PCT Pub. Date: Sep. 29, 2016

(65) Prior Publication Data
US 2018/0019130 A1    Jan. 18, 2018

(51) Int. Cl.
*H01L 21/266*  (2006.01)
*H01L 21/04*   (2006.01)
*H01L 21/265*  (2006.01)
*H01L 29/16*   (2006.01)
(Continued)

(52) U.S. Cl.
CPC ........ *H01L 21/266* (2013.01); *H01L 21/0465* (2013.01); *H01L 21/26546* (2013.01);
(Continued)

(58) Field of Classification Search
None
See application file for complete search history.

(56) References Cited

U.S. PATENT DOCUMENTS 4,676,869 A * 6/1987 Lee .................. H01L 21/31111
                                                257/E21.251
9,111,852 B2 * 8/2015 Aketa .................. H01L 29/872
(Continued)

FOREIGN PATENT DOCUMENTS

JP    S59-104143 A    6/1984
JP    S61-259528 A    11/1986
(Continued)

OTHER PUBLICATIONS

An Office Action; "Notification of Reason(s) for Refusal," issued by the Japanese Patent Office dated Aug. 8, 2017, which corresponds to Japanese Patent Application No. 2017-507271 and is related to U.S. Appl. No. 15/546,878; with English language partial translation.

(Continued)

*Primary Examiner* — Jack Chen
(74) *Attorney, Agent, or Firm* — Studebaker & Brackett PC

(57) ABSTRACT

Provided is a method including the following steps: forming an insulating film having a thickness of 0.5 μm or greater on an epitaxial layer provided with a well region, a source region, and a contact region, each being an impurity diffusion region; forming, in the insulating film, an opening that has a dimension of 2 mm×2 mm or greater in a plan view to expose at least part of the impurity diffusion region from the insulating film. The step of forming the opening in the insulating film is performed by the following separate steps: removing the insulating film so as to leave one-half or less of the thickness of the insulating film unremoved, through dry etching by the use of a photoresist; and removing the insulating film until the opening reaches the upper surface of the epitaxial layer, through wet etching by the use of the same photoresist.

5 Claims, 10 Drawing Sheets

(51) Int. Cl.
  *H01L 29/20* (2006.01)
  *H01L 29/66* (2006.01)
  *H01L 29/78* (2006.01)
  *H01L 29/861* (2006.01)
  *H01L 21/311* (2006.01)

(52) U.S. Cl.
  CPC ...... *H01L 29/1608* (2013.01); *H01L 29/2003* (2013.01); *H01L 29/6606* (2013.01); *H01L 29/66068* (2013.01); *H01L 29/66136* (2013.01); *H01L 29/66712* (2013.01); *H01L 29/7802* (2013.01); *H01L 29/8611* (2013.01); *H01L 21/31111* (2013.01)

(56) References Cited

U.S. PATENT DOCUMENTS

2005/0196905 A1* 9/2005 Onda .................. H01L 21/0274
                                                    438/125
2008/0290348 A1 11/2008 Yoshie

FOREIGN PATENT DOCUMENTS

| JP | S62-118529 A | 5/1987 |
| JP | S63-019823 A | 1/1988 |
| JP | S63-107119 A | 5/1988 |
| JP | H09-022998 A | 1/1997 |
| JP | 2002-093742 A | 3/2002 |
| JP | 2005-236062 A | 9/2005 |
| JP | 2008-294171 A | 12/2008 |
| JP | 2013-030618 A | 2/2013 |

OTHER PUBLICATIONS

International Search Report issued in PCT/JP2015/059299; dated May 26, 2015.
Notification of Transmittal of Translation of the International Preliminary Report on Patentability (Chapter I) and Translation of Written Opinion of the International Searching Authority; PCT/JP2015/059299; dated Oct. 5, 2017.

* cited by examiner

F I G . 1
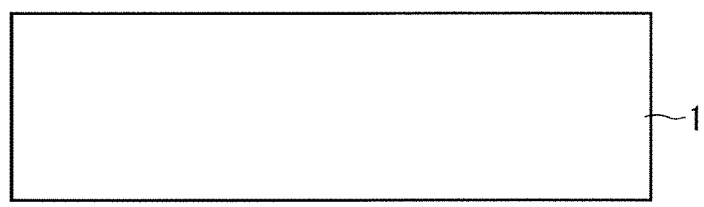
F I G . 2
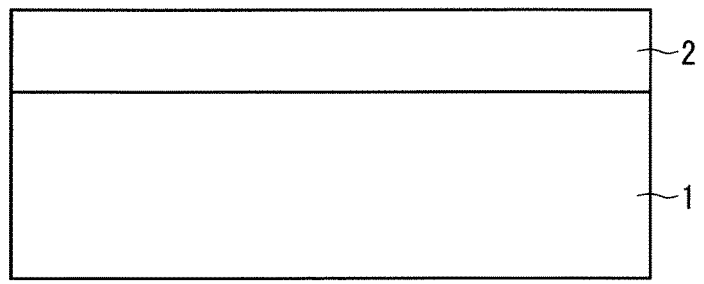
F I G . 3
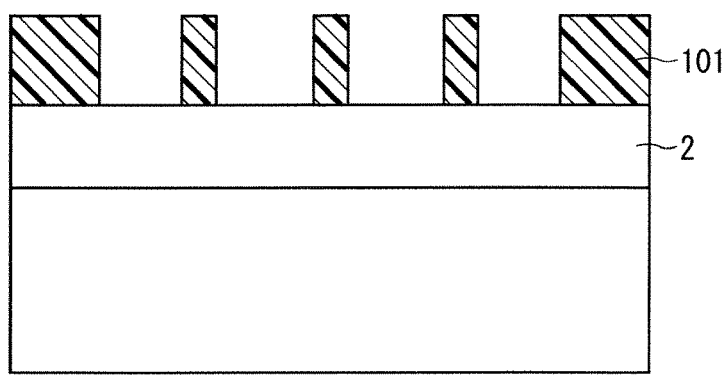

F I G . 1 0
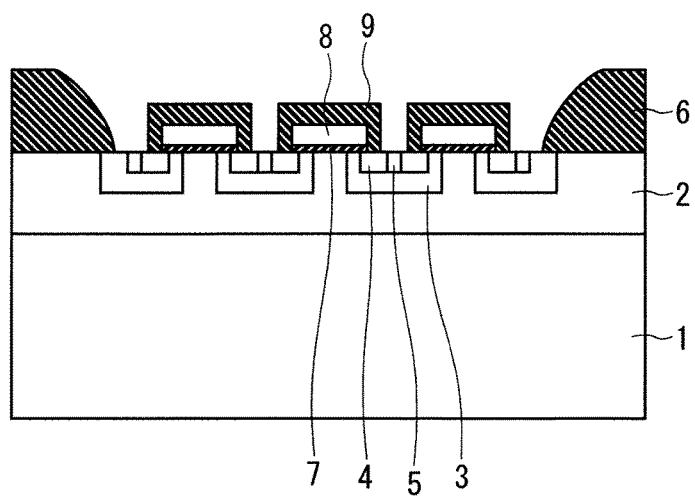
F I G . 1 1
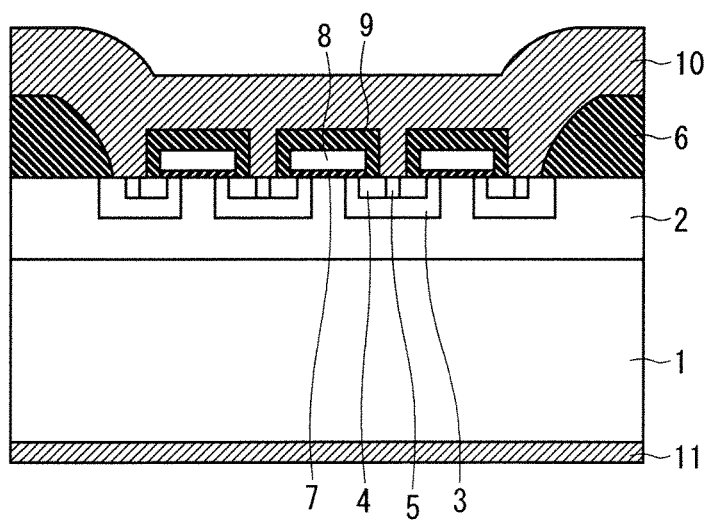

F I G . 1 7
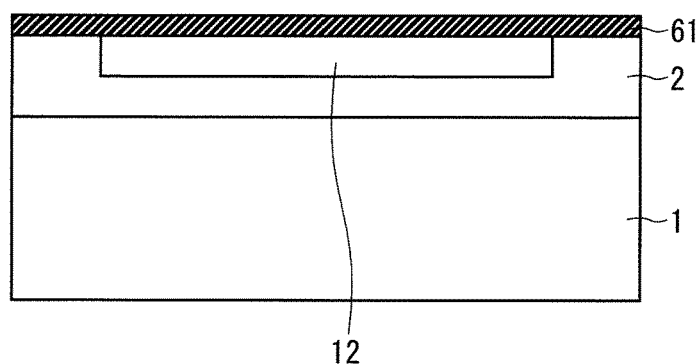
F I G . 1 8
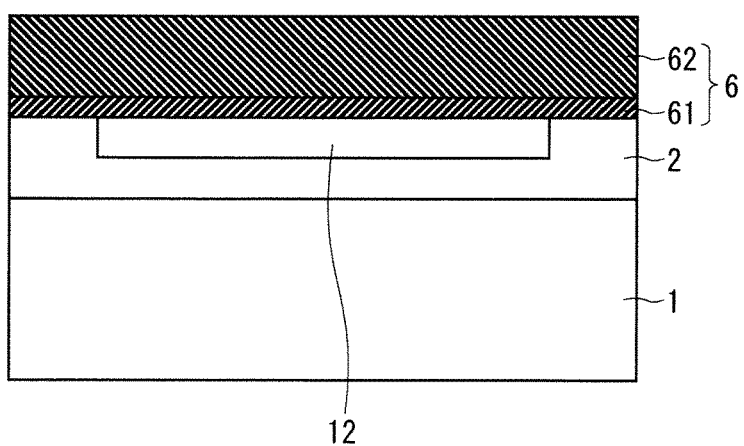

F I G . 1 9
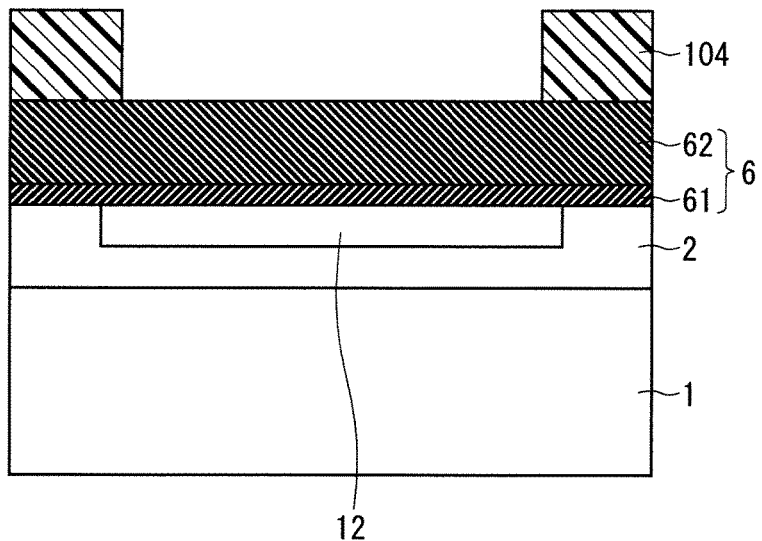
F I G . 2 0
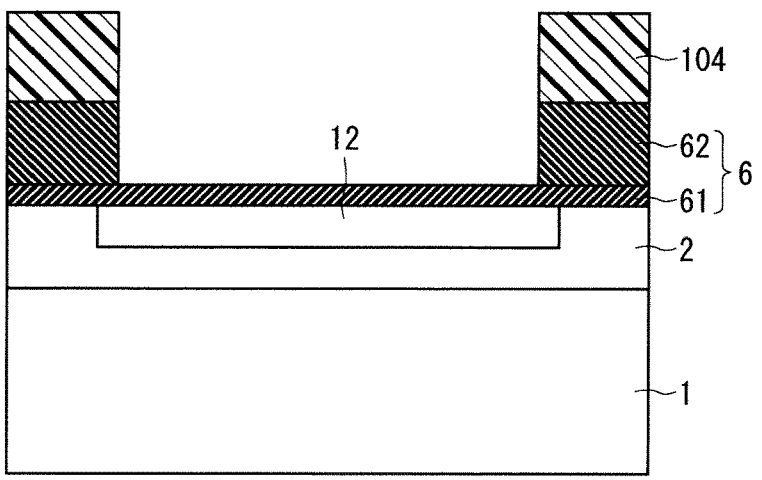

METHOD FOR MANUFACTURING SEMICONDUCTOR DEVICE

TECHNICAL FIELD

The present invention relates to a method for manufacturing a semiconductor device, and particularly, to a technique of forming a pattern of an insulating film on a semiconductor substrate.

BACKGROUND ART

Examples of elements used for power semiconductor devices such as inverters include Schottky barrier diodes (SBDs), metal-oxide-semiconductor field-effect transistors (MOSFETs), and insulated gate bipolar transistors (IGBTs). Power semiconductor devices each containing silicon (Si) as a semiconductor material, have been gradually approaching their limits of the theoretical physical properties of silicon in recent years. Hence, attention is now drawn to compound semiconductor materials, such as silicon carbide (SiC) and gallium nitride (GaN) that go beyond the limit of the theoretical physical properties of silicon. Accordingly, power semiconductor devices containing such semiconductor materials are under development.

Some compound semiconductors have lattice constants smaller than the lattice constant (5.43 Å) of Si (1 Å=0.1 nm). Examples of such compound semiconductors include GaN (a=3.189 Å, c=5.185 Å), 3C—SiC (4.36 Å), 4H—SiC (a=3.07 Å, c=10.05 Å), and 6H—SiC (a=3.08 Å, c=15.1 Å). A semiconductor substrate having a small lattice constant has a small coefficient of diffusion of ions as doped; in addition, the semiconductor substrate needs to undergo heat treatment for activating the doped ions (annealing for activation) at a high temperature of 1500° C. or higher. Hence, the annealing for activation needs to be performed prior to forming a pattern of an insulating film (especially, Si-based insulating film) on the semiconductor substrate. Accordingly, the pattern formation of the insulating film desirably has a small effect on an impurity diffusion region, which is previously formed.

For example, Patent Document 1 discloses patterning of a field insulating film that is formed on a SiC substrate and has a thickness ranging from about 100 to 600 nm, where the patterning includes the following processes: first, the field insulating film undergoes dry etching until it becomes several ten nanometers in thickness; and the field insulating film then undergoes wet etching.

PRIOR ART DOCUMENT

Patent Document

Patent Document 1: Japanese Patent Application Laid-Open No. 2002-093742

SUMMARY

Problem to be Solved by the Invention

A typical method of patterning a Si-based insulating film is dry etching or wet etching with an etching mask. In the dry etching for the patterning of the insulating film, different sites likely have different amounts of etching (amounts of removal). Thus, variations in amount of removal of the surface of the semiconductor substrate cause an impurity concentration profile of the impurity diffusion region, which is previously formed, to be varied, thereby causing electrical properties of, for instance, current paths or voltage-holding region to be varied from site to site. This unfortunately degrades the reliability of the semiconductor device. A semiconductor device having a large area, such as the power semiconductor device, particularly, a MOS-structured element with a channel disposed in a top layer of a semiconductor substrate clearly faces such a problem.

In contrast, the wet etching for the patterning of the insulating film shows a high degree of isotropy. Thus, the side surfaces of the insulating film greatly recede in a lateral direction in the patterning. It is thus difficult to form a fine pattern. In addition, designing the pattern to reflect the recession produces a large chip. A semiconductor device, such as the power semiconductor device, that includes a thick insulating film clearly faces such a problem.

The present invention has been achieved to solve these problems. It is an object of the present invention to provide a method for manufacturing a semiconductor device that has a small influence on a semiconductor substrate and in which a fine pattern of an insulating film is formed.

Means to Solve the Problem

A method for manufacturing a semiconductor device according to the present invention includes the following steps: forming an impurity diffusion region in a semiconductor layer; forming an insulating film having a thickness of 0.5 μm or greater on the semiconductor layer; forming an etching mask on the insulating film; and forming, in the insulating film, an opening that reaches the upper surface of the semiconductor layer and has a dimension of 2 mm×2 mm or greater in a plan view, through etching by the use of the etching mask as a mask to expose at least part of the impurity diffusion region from the insulating film. The step of forming the opening includes the following steps: removing the insulating film so as to leave one-half or less of the thickness of the insulating film unremoved, through dry etching by the use of the etching mask as a mask; and removing the insulating film until the opening reaches the upper surface of the semiconductor layer, through wet etching by the use of the etching mask as a mask.

Effects of the Invention

In the present invention, the step of forming the opening having a dimension of 2 mm×2 mm or greater in the insulating film having a thickness of 0.5 μm or greater, is performed by the following steps: removing the insulating film so as to leave one-half or less of the thickness of the insulating film unremoved, through the dry etching, which has a high capability of regulating a dimension; and after that, removing the rest of the insulating film through wet etching by which the surface of the semiconductor substrate is not removed. Such a configuration prevents variations in amount of removal of the surface of the impurity diffusion region under the opening while maintaining high dimensional-accuracy of the opening. The high dimensional-accuracy enables a fine pattern of the insulating film, thereby contributing to miniaturization of the semiconductor device. Further, the amount of removal of the surface of the impurity diffusion region is uniform. This reduces variations in impurity concentration profile of the impurity diffusion region, and enables improved reliability of the semiconductor device.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a diagram of a process step, illustrating a method for manufacturing a semiconductor device according to a first embodiment.

FIG. 2 is a diagram of a process step, illustrating the method for manufacturing the semiconductor device according to the first embodiment.

FIG. 3 is a diagram of a process step, illustrating the method for manufacturing the semiconductor device according to the first embodiment.

FIG. 10 is a diagram of a process step, illustrating the method for manufacturing the semiconductor device according to the first embodiment.

FIG. 11 is a diagram of a process step, illustrating the method for manufacturing the semiconductor device according to the first embodiment.

FIG. 17 is a diagram of a process step, illustrating the method for manufacturing the semiconductor device according to the second embodiment.

FIG. 18 is a diagram of a process step, illustrating the method for manufacturing the semiconductor device according to the second embodiment.

FIG. 19 is a diagram of a process step, illustrating the method for manufacturing the semiconductor device according to the second embodiment.

FIG. 20 is a diagram of a process step, illustrating the method for manufacturing the semiconductor device according to the second embodiment.

DESCRIPTION OF EMBODIMENT(S)

<First Embodiment>

Figure 4:
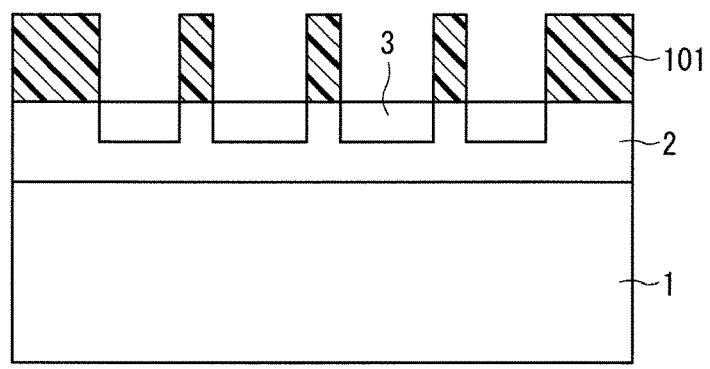
FIG. 4 is a diagram of a process step, illustrating the method for manufacturing the semiconductor device according to the first embodiment.
Figure 5:
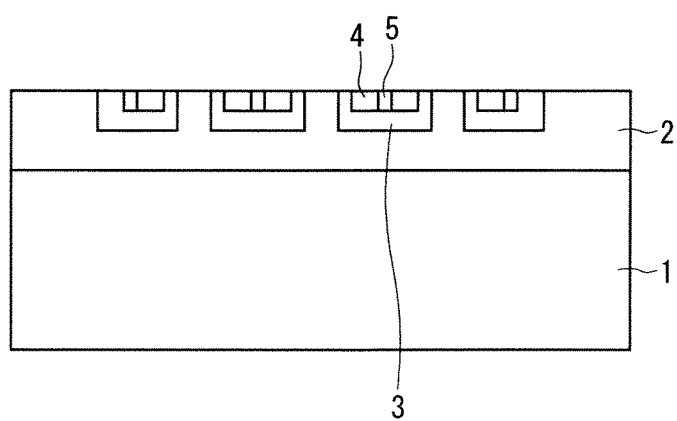
FIG. 5 is a diagram of a process step, illustrating the method for manufacturing the semiconductor device according to the first embodiment.
Figure 6:
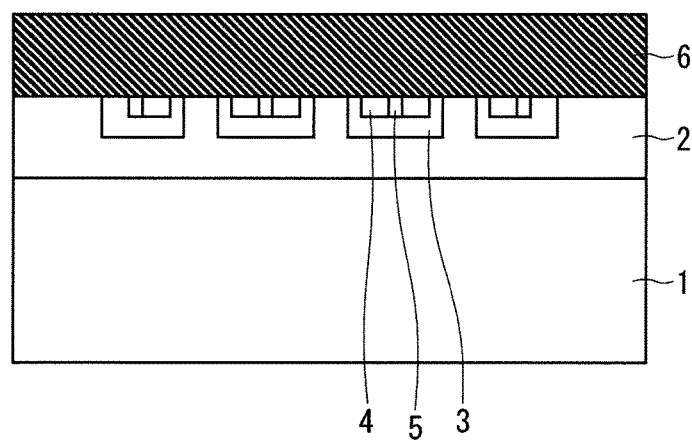
FIG. 6 is a diagram of a process step, illustrating the method for manufacturing the semiconductor device according to the first embodiment.
Figure 7:
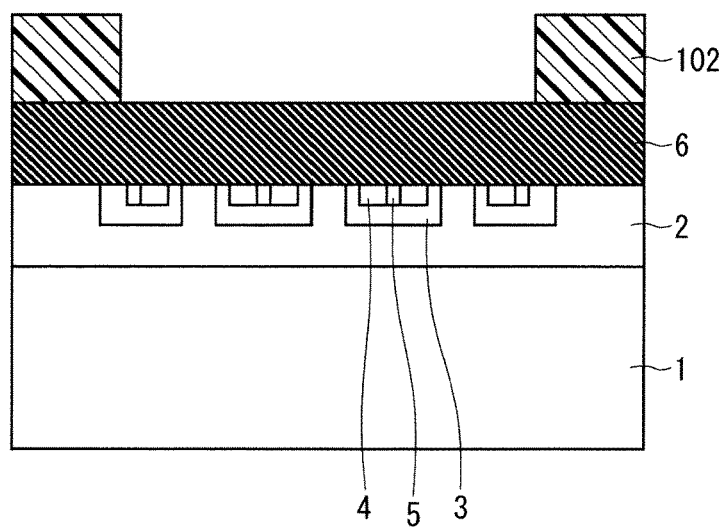
FIG. 7 is a diagram of a process step, illustrating the method for manufacturing the semiconductor device according to the first embodiment.
Figure 8:
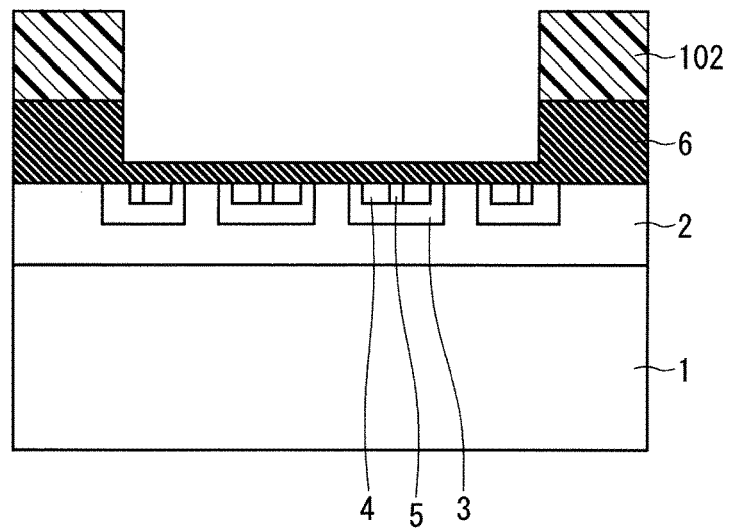
FIG. 8 is a diagram of a process step, illustrating the method for manufacturing the semiconductor device according to the first embodiment.

The following describes a method for manufacturing a semiconductor device according to a first embodiment. FIGS. 1 to 11 are diagrams of process steps, illustrating the method for manufacturing the semiconductor device, and are cross-sectional views of the semiconductor device in each process step. The first embodiment illustrates an n-channel MOSFET as a power semiconductor device.

The initial step (FIG. 1) is preparing an n-type semiconductor substrate 1 made of silicon carbide, which has a low resistance. The following step (FIG. 2) is growing an epitaxial layer 2 (semiconductor layer) made of n-type silicon carbide on the semiconductor substrate 1.

The next step (FIG. 3) is forming, on the epitaxial layer 2, a photoresist 101 (injection mask) provided with openings over regions in which well regions of the MOSFET are to be formed, by the use of photolithography. The following step (FIG. 4) is doping the epitaxial layer 2 with a p-type impurity by selective ion implantation using the photoresist 101 as a mask to form, in a top layer of the epitaxial layer 2, well regions 3 that are each a p-type impurity diffusion region.

The further step (FIG. 5) is forming, in upper layers within the well regions 3, source regions 4 that are each an n-type impurity diffusion region, and contact regions 5 that are each a p-type impurity diffusion region by selective ion implantation using a similar technique. It is noted that a portion in a top layer of each well region 3, outside the source region 4 is to be a channel region of the MOSFET.

The subsequent step is an annealing process at a temperature of 1500° C. or higher for activating the injected impurity in the well regions 3, the source regions 4 and the contact regions 5.

After the annealing for activation, the next step (FIG. 6) is depositing, on the surface of the epitaxial layer 2, an insulating film 6 composed of a silicon oxide film so as to have a thickness of 0.5 µm or greater. Here, the insulating film 6 has a thickness of about 1200 nm.

The following step (FIG. 7) is forming, on the insulating film 6, a photoresist 102 (etching mask) with an opening over a region in which the MOSFET is to be formed, by the use of photolithography. The opening of the photoresist 102 is set to have a dimension of 2 mm□ or greater (2 mm×2 mm or greater in dimension) in a plan view. Then, the insulating film 6 undergoes etching by the use of the photoresist 102 as a mask to form, in the insulating film, an opening that reaches the upper surface of the epitaxial layer 2. The etching of the insulating film 6 is performed through the combination of a dry etching process and a wet etching process, the details of which are described below.

The first step (FIG. 8) is removing the insulating film 6 so as to leave one-half or less of the thickness of the insulating film 6 unremoved, through dry etching by the use of the photoresist 102 as a mask. Here, the insulating film 6 undergoes one-minute etching at an etching rate of 850 nm/min using a parallel-plate apparatus for dry etching. As a result, an approximately 300 nm thick insulating film 6 remains at the bottom of an opening formed in the insulating film 6.

Figure 9:
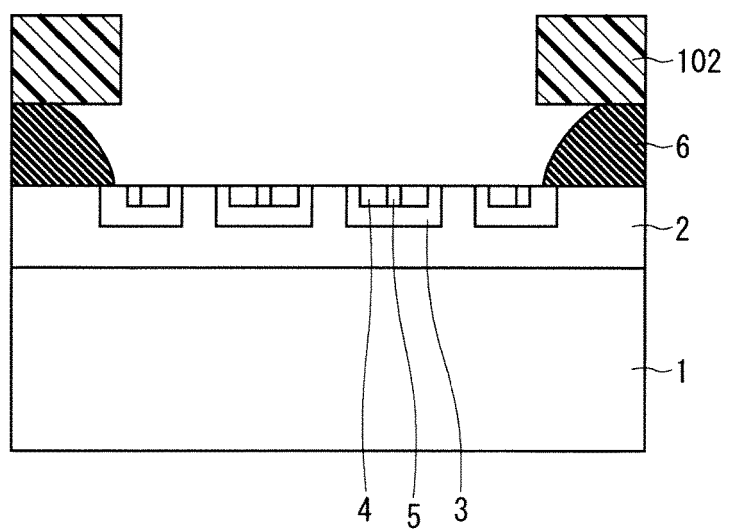
FIG. 9 is a diagram of a process step, illustrating the method for manufacturing the semiconductor device according to the first embodiment.
Figure 12:
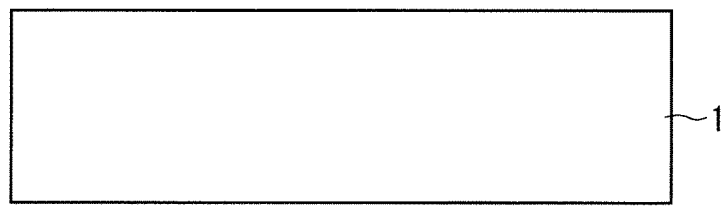
FIG. 12 is a diagram of a process step, illustrating a method for manufacturing a semiconductor device according to a second embodiment.
Figure 13:
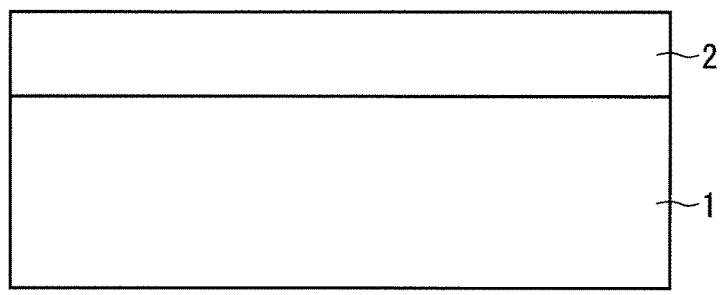
FIG. 13 is a diagram of a process step, illustrating the method for manufacturing the semiconductor device according to the second embodiment.
Figure 14:
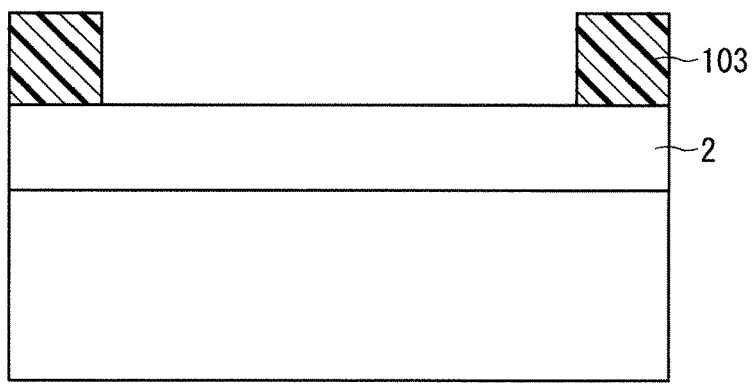
FIG. 14 is a diagram of a process step, illustrating the method for manufacturing the semiconductor device according to the second embodiment.
Figure 15:
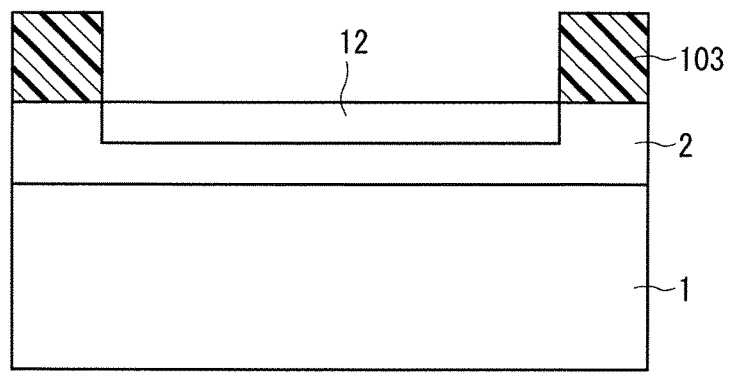
FIG. 15 is a diagram of a process step, illustrating the method for manufacturing the semiconductor device according to the second embodiment.
Figure 16:
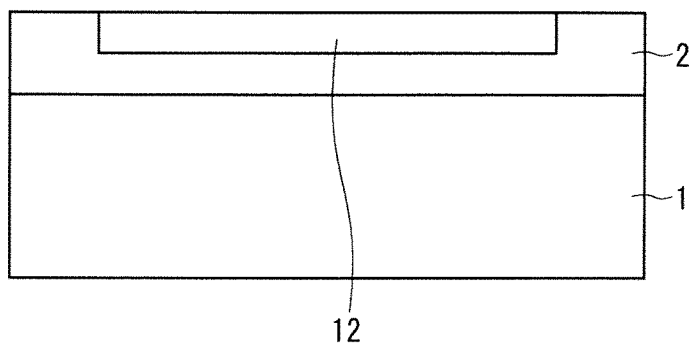
FIG. 16 is a diagram of a process step, illustrating the method for manufacturing the semiconductor device according to the second embodiment.
Figure 21:
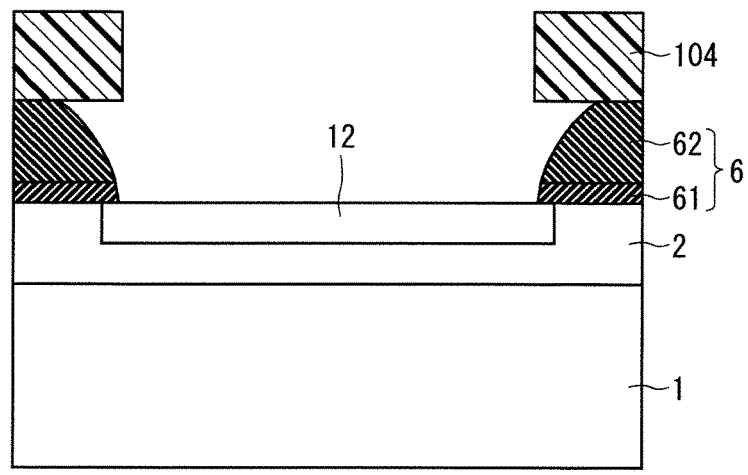
FIG. 21 is a diagram of a process step, illustrating the method for manufacturing the semiconductor device according to the second embodiment.
Figure 22:
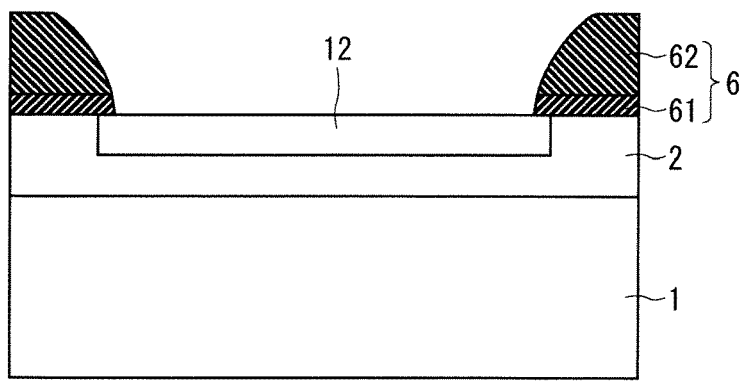
FIG. 22 is a diagram of a process step, illustrating the method for manufacturing the semiconductor device according to the second embodiment.

The second step (FIG. 9) is removing the insulating film 6, which remains at the bottom of the opening, through wet etching by the use of, as a mask, the same photoresist 102 as used in the dry etching to cause the opening to reach the surface of the epitaxial layer 2. Here, the wet etching process with buffered hydrofluoric acid (BHF), where $NH_4F:HF=10:1$, lasts for six minutes. The wet etching shows a high degree of isotropy; in addition, the side surfaces of the insulating film 6 undergo etching. Hence, the side surfaces of the insulating film 6 are each inclined, as illustrated in FIG. 9. Thus, the opening formed in the insulating film 6 is shaped so as to be wide upward.

When the opening formed in the insulating film 6 reaches the surface of the epitaxial layer 2, the well regions 3, the source regions 4, and the contact regions 5, all of which are the impurity diffusion regions formed in the top layer of the epitaxial layer 2, are exposed from the insulating film 6. The exposed well regions 3 each include the channel region of the MOSFET.

The subsequent step (FIG. 10) is removing the photoresist 102 by $O_2$-plasma ashing, followed by forming gate insulating films 7 each composed of a silicon oxide film, and gate electrodes 8 each made of polysilicon onto the epitaxial layer 2, followed by forming interlayer insulating films 9 so as to cover the gate insulating films 7 and the gate electrodes 8. The interlayer insulating films 9 are each provided with a contact hole that reaches the source region 4 and the contact region 5.

The final step (FIG. 11) is forming a source electrode 10 made of aluminum onto the interlayer insulating films 9, followed by forming a drain electrode 11 on the back surface of the semiconductor substrate 1. This completes the MOSFET.

As described above, in the first embodiment, the step of forming the opening having a large bore (2 mm×2 mm or greater in dimension) in the thick (0.5 μm or greater in thickness) insulating film 6, is performed by removing the insulating film 6 so as to leave one-half or less of the thickness of the insulating film 6 unremoved, through dry etching, which has a high capability of regulating a dimension, followed by removing the rest of the insulating film 6 through wet etching by which the surface of the semiconductor substrate is not removed. This prevents variations in amount of removal of the surface of the impurity diffusion region under the opening while maintaining high dimensional-accuracy of the opening. The high dimensional-accuracy provides a fine pattern with the insulating film 6, thereby contributing to miniaturization of the semiconductor device. Further, the amount of removal of the surface of the impurity diffusion region (well region 3, source region 4, and contact region 5) is uniform, thereby reducing variations in impurity concentration profile of the impurity diffusion region and enabling improved reliability of the semiconductor device. Still further, the side surfaces of the insulating film 6 are each inclined as a result of the wet etching process, thereby enabling the source electrode 10, made of aluminum, to have improved coverage of the insulating film 6.

<Second Embodiment>

The following describes a method for manufacturing a semiconductor device according to a second embodiment. FIGS. 12 to 22 are diagrams of process steps illustrating the method for manufacturing the semiconductor device, and are cross-sectional views of the semiconductor device in each process step. The second embodiment illustrates a pn junction diode as a power semiconductor device.

The initial step (FIG. 12) is preparing the n-type semiconductor substrate 1 made of silicon carbide, which has a low resistance. The following step (FIG. 13) is growing the epitaxial layer 2 (semiconductor layer) made of n-type silicon carbide on the semiconductor substrate 1.

The next step (FIG. 14) is forming, on the epitaxial layer 2, a photoresist 103 (injection mask) provided with an opening over a region in which an anode region of the diode is to be formed, by the use of photolithography. The following step (FIG. 15) is doping the epitaxial layer 2 with a p-type impurity by selective ion implantation using the photoresist 103 as a mask to form, in the top layer of the epitaxial layer 2, an anode region 12 that is a p-type impurity diffusion region.

The subsequent step (FIG. 16) is removing the photoresist 103, followed by an annealing process at a temperature of 1500° C. or higher for activating the injected impurity in the anode region 12.

After the annealing for activation, the next step is forming the insulating film 6 so as to have a thickness of 0.5 μm or greater on the surface of the epitaxial layer 2. The second embodiment illustrates that the insulating film 6 is a stack of a first insulating film 61 and a second insulating film 62 disposed thereon. The second insulating film 62 is set to be thicker than the first insulating film 61; that is, the second insulating film 62 is set to have a thickness such that the second insulating film 62 occupies one-half or greater of the thickness of the insulating film 6. Further, the second insulating film 62 preferably has a greater selectivity with respect to a photoresist 104 that is used in a dry etching process, which will be described later on, than the first insulating film 61. Still further, the first insulating film 61 preferably has a smaller etching rate in a wet etching process, which will be described later on, than the second insulating film 62. Here, the insulating film 6 is formed by depositing, on the epitaxial layer 2, the first insulating film 61 composed of a 300 nm thick silicon oxide film (FIG. 17) and depositing, on the first insulating film 61, the second insulating film 62 composed of a 1200 nm thick silicon nitride film (FIG. 18).

The subsequent step (FIG. 19) is forming, on the insulating film 6, a photoresist 104 (etching mask) with an opening over a region in which the diode is to be formed, by the use of photolithography. The opening of the photoresist 104 is set to have a dimension of 2 mm□ or greater (2 mm×2 mm or greater in dimension) in a plan view. Then, the insulating film 6 undergoes etching by the use of the photoresist 104 as a mask to form, in the insulating film 6, an opening that reaches the upper surface of the epitaxial layer 2. The etching of the insulating film 6 is performed through the combination of a dry etching process and a wet etching process, the details of which are described below.

The first step (FIG. 20) is removing the second insulating film 62 through dry etching by the use of the photoresist 104 as a mask. The first insulating film 61 is left, at the bottom of the opening, unremoved by one-half or less of the thickness of the insulating film 6 (300 nm). Here, the insulating film 6 undergoes three-minute etching at an etching rate of 400 nm/min using a parallel-plate apparatus for dry etching. Since the second insulating film 62 has a greater selectivity with respect to the photoresist 104 in the dry etching process, than the first insulating film 61, an over-etching process in this process step scarcely removes the upper surface of the first insulating film 61. This reduces variations in amount of removal of the insulating film 6 as a result of the dry etching process.

The second step (FIG. 21) is removing the first insulating film 61, which remains at the bottom of the opening, through wet etching by the use of, as a mask, the same photoresist 104 as that in the dry etching of the second insulating film 62 to thus cause the opening to reach the surface of the epitaxial layer 2. Here, the wet etching process with buffered hydrofluoric acid (BHF), where NH$_4$F:HF=10:1, lasts for six minutes. The wet etching shows a high degree of isotropy; in addition, the side surfaces of the insulating film 6 (first insulating film 61 and second insulating film 62) undergo etching. Hence, the side surfaces of the insulating film 6 are each inclined, as illustrated in FIG. 9. Thus, the opening formed in the insulating film 6 is shaped so as to be wide upward. Meanwhile, the first insulating film 61 has a smaller etching rate in the wet etching process, than the second insulating film 62. Hence, the side surfaces of the second insulating film 62 involve a relatively less amount of recession. This maintains high dimensional-accuracy at the bottom of the opening of the insulating film 6.

When the opening formed in the insulating film 6 reaches the surface of the epitaxial layer 2, the anode region 12, which is the impurity diffusion region formed in the top layer of the epitaxial layer 2, is exposed from the insulating film 6. Then, the photoresist 104 is removed by O$_2$-plasma ashing, an anode electrode (not shown) made of aluminum is formed on the epitaxial layer 2 and a cathode electrode (not shown) made of aluminum is formed on the back surface of the semiconductor substrate 1. This completes the diode.

In the second embodiment, the step of forming the opening having a large bore (2 mm×2 mm or greater in dimension) in the thick (0.5 μm or greater in thickness) insulating film 6, is performed by removing the second insulating film 62 so as to leave the first insulating film 61 unremoved by one-half or less of the thickness of the insulating film 6, through dry etching, which has a high capability of regulating a dimension, followed by removing the rest of the second insulating film 62 through wet etching by which the surface of the semiconductor substrate is not removed. This prevents variations in amount removal of the surface of the impurity diffusion region under the opening while maintaining high dimensional-accuracy of the opening. The high dimensional-accuracy provides a fine pattern with the insulating film 6, thereby contributing to miniaturization of the semiconductor device. Further, the amount of removal of the surface of the impurity diffusion region (anode region 12) is uniform, thereby reducing variations in impurity concentration profile of the impurity diffusion region and enabling improved reliability of the semiconductor device. Still further, the side surfaces of the insulating film 6 are each inclined as a result of the wet etching process, thereby enabling the anode electrode, made of aluminum, to have improved coverage of the insulating film 6.

In the Description, the first embodiment describes the MOSFET as one example of the semiconductor device; and the second embodiment, the pn junction diode. The present invention is widely applicable to a method for manufacturing a semiconductor device, the method including the step of forming a pattern of an insulating film on a semiconductor substrate with an impurity diffusion region disposed in a top layer of the semiconductor substrate. In addition, although the above descriptions employ SiC as a material of the semiconductor substrate, a material such as GaN, having a lattice constant than a lattice constant of Si yields a similar effect.

It is noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 1 semiconductor substrate, 2 epitaxial layer, 3 well region, 4 source region, 5 contact region, 6 insulating film, 61 first insulating film, 62 second insulating film, 7 gate insulating film, 8 gate electrode, 9 interlayer insulating film, 10 source electrode, 11 drain electrode, 12 anode region, and 101 to 104 photoresist.

The invention claimed is:

1. A method for manufacturing a semiconductor device, comprising the steps of:
   forming an impurity diffusion region in a semiconductor layer;
   forming an insulating film having a thickness of 0.5 μm or greater on said semiconductor layer;
   forming an etching mask on said insulating film; and
   forming, in said insulating film, an opening that reaches an upper surface of said semiconductor layer and has a dimension of 2 mm ×2 mm or greater in a plan view, through etching by the use of said etching mask as a mask to expose at least part of said impurity diffusion region from said insulating film,
   wherein said step of forming said opening comprises the steps of
      removing said insulating film so as to leave one-half or less of a thickness of said insulating film unremoved, through dry etching by the use of said etching mask as a mask, and
      removing said insulating film until said opening reaches said upper surface of said semiconductor layer, through wet etching by the use of said etching mask as a mask,
   wherein said insulating film comprises
      a first insulating film composed of a silicon oxide film, and
      a second insulating film composed of a silicon nitride film that is disposed on said first insulating film and is thicker than said first insulating film, and
   wherein said step of forming said opening is performed by removing said second insulating film in said dry etching and by removing said first insulating film in said wet etching.

2. The method for manufacturing a semiconductor device according to claim 1,
   wherein said second insulating film has a greater selectivity with respect to said etching mask in said dry etching, than said first insulating film, and
   wherein said first insulating film has a smaller etching rate in said wet etching than said second insulating film.

3. The method for manufacturing a semiconductor device according to claim 1, wherein in said step of forming said opening, said impurity diffusion region, which is exposed from said insulating film, comprises a channel region of a transistor.

4. The method for manufacturing a semiconductor device according to claim 1, wherein said semiconductor layer is made of a material having a lattice constant smaller than a lattice constant of silicon.

5. The method for manufacturing a semiconductor device according to claim 4, wherein said semiconductor layer is made of silicon carbide or gallium nitride.

* * * * *